US006816528B1

(12) United States Patent
Kneissl et al.

(10) Patent No.: US 6,816,528 B1
(45) Date of Patent: Nov. 9, 2004

(54) METHOD AND STRUCTURE FOR NITRIDE BASED LASER DIODE ARRAYS ON A CONDUCTING SUBSTRATE

(75) Inventors: Michael A. Kneissl, Sunnyvale, CA (US); David P. Bour, Cupertino, CA (US); Noble M. Johnson, Menlo Park, CA (US); Jack Walker, Georgetown, TX (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/224,254

(22) Filed: Dec. 30, 1998

(51) Int. Cl.[7] ............................................... H01S 5/00
(52) U.S. Cl. ............................ 372/50; 372/43; 372/44; 372/45; 372/46; 372/47; 372/48; 372/49; 372/92
(58) Field of Search .................................. 372/43–50, 92

(56) References Cited

U.S. PATENT DOCUMENTS

| | | | | |
|---|---|---|---|---|
| 4,531,217 A | * | 7/1985 | Kitamura | 372/50 |
| 4,881,237 A | | 11/1989 | Donnelly | 372/50 |
| 5,001,719 A | | 3/1991 | Trussell | 372/50 |
| 5,278,435 A | * | 1/1994 | Vna Hove et al. | 257/184 |
| 5,309,470 A | | 5/1994 | Groussin | 372/50 |
| 5,404,373 A | * | 4/1995 | Cheng | 372/50 |
| 5,408,742 A | | 4/1995 | Zaidel et al. | 438/619 |
| 5,550,856 A | * | 8/1996 | Cheng | 372/50 |
| 5,642,373 A | * | 6/1997 | Kamizato et al. | 372/50 |
| 5,666,376 A | * | 9/1997 | Cheng | 572/50 |
| 5,724,376 A | * | 3/1998 | Kish, Jr. et al. | 372/96 |
| 6,055,262 A | * | 4/2000 | Cox et al. | 372/96 |
| 6,058,123 A | * | 5/2000 | Haase et al. | 372/46 |
| 6,072,818 A | * | 6/2000 | Hayakawa | 372/46 |

OTHER PUBLICATIONS

A. Kuramata, S. Kubota, R. Soejima, K. Domen, K. Horino and T. Tanahashi. "Room–Temperature Continuous Wave Operation of InGaN Laser Diodes with Vertical Conducting Structure on SiC Substrat". Japanese Journal of Applied Physics, vol. 37, Part 2, No. 11B, Nov. 15, 1998, pp. L1373–L1375.
S. Nakamura, M. Senoh, S. Nagahama, N. Iwasa, T. Yamada, T. Matsushita, H. Kiyoku, Y. Sugimoto, T. Kozaki, H. Umemoto, M. Sano and K. Chocho. "Continuous–wave operation of InGaN/GaN/AIGaN–based laser diodes grown on GaN substrates". 0 *Applied Physics Letters*, vol. 72, No. 16, Apr. 10, 1998, pp. 2014–2016
S. Nakamura, M. Senoh, S. Nagahama, N. Iwasa, T. Yamada, T. Matsushita, H. Kiyoku, Y. Sugimoto, T. Kozaki, H. Umemoto, M. Sano and K. Chocho. "InGaN/GaN/AIGaN–based laser diodes with modulation–doped strained– layer superlattices grown on an epitaxially laterally overgrown GaN substrate". *Applied Physics Letters*, vol. 72, No. 2, Jan. 12, 1998, pp. 211–213.
S. Nakamura, G. Fasol. "Th Blue Laser Diode. GaN Based Light Emitters and Las rs." *Springer*, 1997. pp. 34–47, 190–193 & 223–259.

* cited by examiner

*Primary Examiner*—Don Wong
*Assistant Examiner*—Delma R. Flores Ruiz

(57) ABSTRACT

Method and structure for nitride-based laser diode arrays on a conducting substrate are disclosed. Air-bridge structures are used to make compact laser diode arrays suitable for printer applications. The use of a channel structure architecture allows the making of surface emitting laser diode arrays.

20 Claims, 7 Drawing Sheets

METHOD AND STRUCTURE FOR NITRIDE BASED LASER DIODE ARRAYS ON A CONDUCTING SUBSTRATE

CROSS-REFERENCE TO RELATED APPLICATIONS

The present invention is related to copending application "Structure for a Nitride Based Laser on an Insulating Substrate" by M. A. Kneissl, T. L. Paoli, D. P. Bour, N. M. Johnson, and J. Walker, Ser. No. 09/223,112, filed on the same day and assigned to the same assignee which is hereby incorporated by reference in its entirety.

STATEMENT REGARDING FEDERALLY SPONSORED RESEARCH OF DEVELOPMENT

The U.S. Government has a fully paid-up license in this invention and the right in limited circumstances to require the patent owner to license others on reasonable terms as provided for by the terms of contract no. 70NANB 2H-1241 awarded by the Department of Commerce.

BACKGROUND OF THE INVENTION

The present invention relates generally to the field of laser diodes, and more particularly to architecture for short-wavelength nitride based laser diode arrays.

Short-wavelength nitride based laser diodes provide smaller spot size and a better depth of focus than red and infrared (IR) laser diodes for laser printing operations and other applications. Single-spot nitride laser diodes have applications in areas such as optical storage.

Laser diode arrays are desirable for application to high speed laser printing. Printing at high speeds and at high resolution requires laser arrays due to the fundamental limits of polygon rotation speed, laser turn-on times and laser power. Laser diode arrays have previously been employed using red and infrared laser diode structures. Dual-spot red lasers and quad-spot infrared lasers have been used for laser printers.

Laser diodes based on higher bandgap semiconductor alloys such as AlGaInN have been developed. Excellent semiconductor laser characteristics have been established in the near-UV to violet spectrum, principally by Nichia Chemical Company of Japan. See for example, A. Kuramata et al., "Room-temperature CW operation of InGaN Laser Diodes with a Vertical Conducting Structure on SiC Substrate", Japanese Journal of Applied Physics, Vol. 37, L1373 (1998), S. Nakamura et al., "CW Operation of InGaN/GaN/AlGaN-based laser diodes grown on GaN substrates", Applied Physics Letters, Vol. 72(6), 2014 (1998) and S. Nakamura and G. Fasol, "The Blue Laser Diode-GaN based Light Emitters and Lasers", (Springer-Verdag, 1997) all of which are incorporated by reference in their entirety.

Extension of quad-spot laser diodes to shorter wavelengths enables printing at higher resolution. Growth of quad-spot laser diodes on conducting substrates allows a common backside contact for all laser diodes in the array.

SUMMARY OF THE INVENTION

Architectures using conducting substrates for nitride dual-spot laser diode arrays allow the use of common backside contacts for all devices in the laser diode array to permit a compact layout. Elimination of cleavage plane misalignment with GaN by using a conducting substrate enables the formation of high quality cleaved mirror facets without dry etching.

The metallization scheme on the frontside of the nitride based laser diode array structures is similar to that used in red and infrared lasers. Frontside contacts on quad-spot laser array structures are arranged to provide separate p-metal contacts for each laser diode. However, certain compact layouts result in small unpumped sections in two of the lasers making up the quad-spot structure due to necessary breaks in the contact pad structure to allow contact paths to the remaining laser pair. The presence of unpumped sections in a nitride based laser diode can have adverse effects such as raising the required threshold current density.

A layout that overcomes the problem of unpumped sections but still retains the compact structure needed in printing applications employs air-bridge contact structures to cross over intervening metal contact areas. This isolates the contacts to the laser diodes while avoiding having unpumped sections. Air-bridge contact structures also allow minimization of parasitic capacitance effects between contacts.

Surface emitting quad-spot laser diode arrays may be made on a conducting substrate using a channel structure between two dual-spot laser diode arrays. The channel structure contains mirrors to outcouple light at various angles to the laser cavity. This scheme is readily generalizable to produce surface emitting laser diode arrays containing an arbitrary number of laser diodes.

Thus, the present invention and its various embodiments provide numerous advantages as will be described in further detail below.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

FIG. 1b shows a cross-sectional view of the embodiment in FIG. 1a.

FIG. 3b shows a cross-sectional view of the embodiment in FIG. 3a.

FIG. 4b shows a cross-sectional view of the embodiment in FIG. 4a.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof.

Figure 1A:
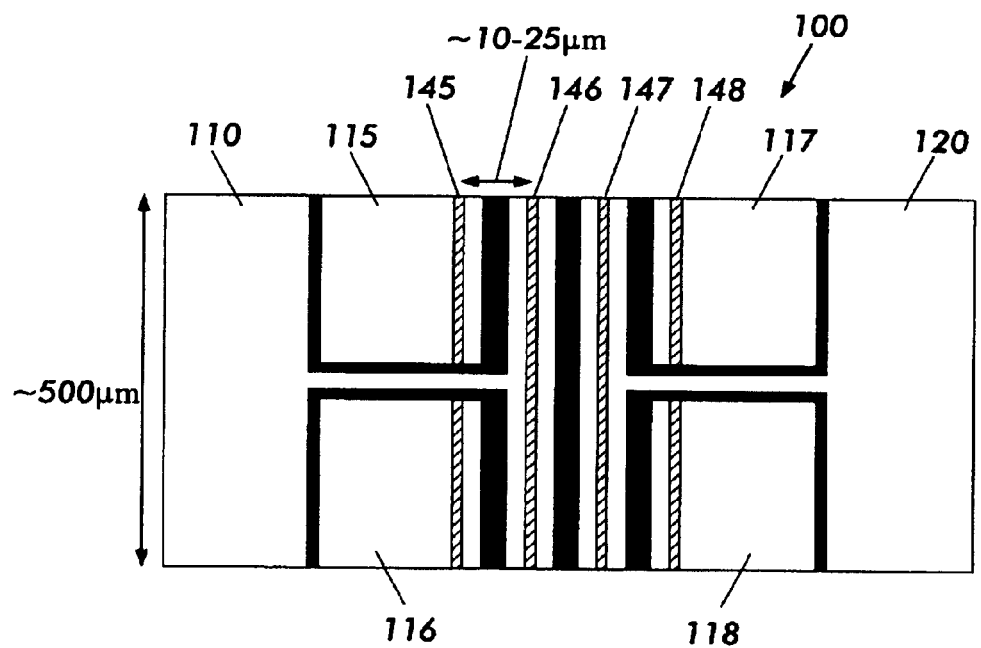
FIG. 1a shows a top view of the layout of a quad-spot laser diode structure in an embodiment in accordance with the present invention.
Figure 1B:
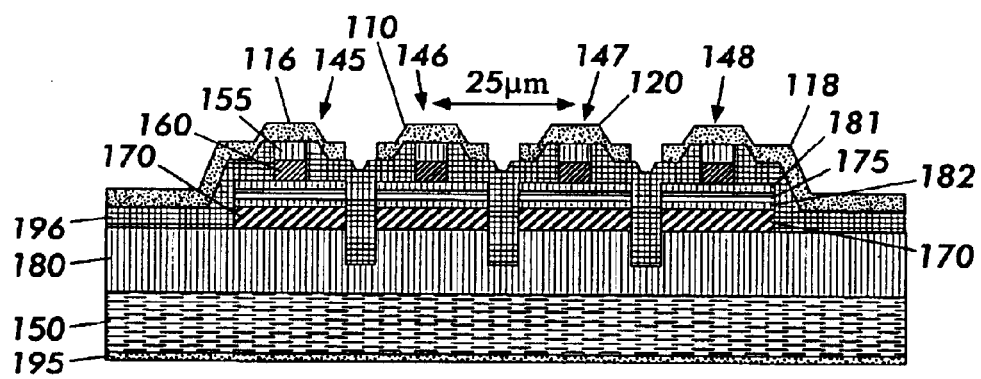

An embodiment in accordance with the present invention is shown in FIGS. 1a and 1b. FIGS. 1a and 1b show quad-spot InGaAlN laser diode structure 100 grown on conducting substrate 150 which is typically SiC or GaN. Structure 100 shows laser diode 145 having two p-metal contacts 115 and 116 and laser diode 148 having two p-metal contacts 117 and 118. Laser diode 146 is contacted by p-metal contact 110 and laser diode 147 is contacted by p-metal contact 120. Note that the middle section of laser diodes 145 and 148 are unpumped due to the need to bring p-metal contact 110 to laser diode 146 and to bring p-metal contact 120 to laser diode 147. Having an unpumped region in laser diodes 145 and 148 produces an absorption loss which raises the required threshold current densities for laser diodes 145 and 148. Separation between individual laser diodes 145, 146, 147 and 148 is typically about 10 to 25 μm.

FIG. 1b shows a cross-sectional view of quad-spot InGaAlN laser diode structure 100. P-GaN cap layer 155 is positioned atop p-AlGaN cladding layer 160. The active region is InGaN layer 175 that has a multi-quantum well structure and is positioned above n-AlGaN cladding layer 170. Layer 180 is n-GaN and resides on conducting layer 150 which is typically SiC or n-GaN. Insulating layer 196 separates p-metal contacts from n-type regions of laser diode structure 100. Common backside n-contact 195 closes the current loop to lasers 145, 146, 147 and 148.

Figure 2:
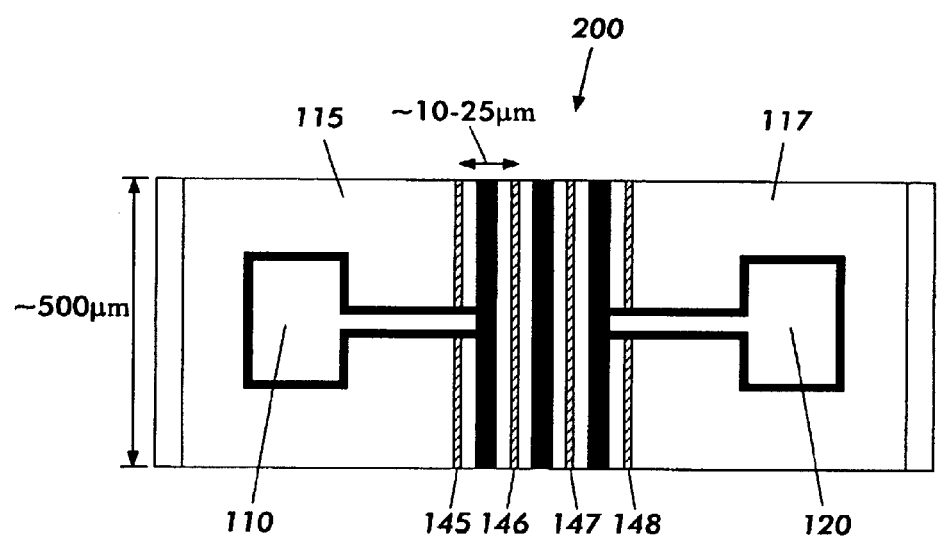
FIG. 2 shows a top view of the layout of a quad-spot laser diode structure in an embodiment in accordance with the present invention.

FIG. 2 shows a layout of quad-spot InGaAlN laser diode structure 200 which is a variation of the metallization scheme shown in FIG. 1a. Outer laser diodes 146 and 148 each have only one p-metal contact pad, p-metal contact pads 115 and 117, respectively.

Figure 3A:
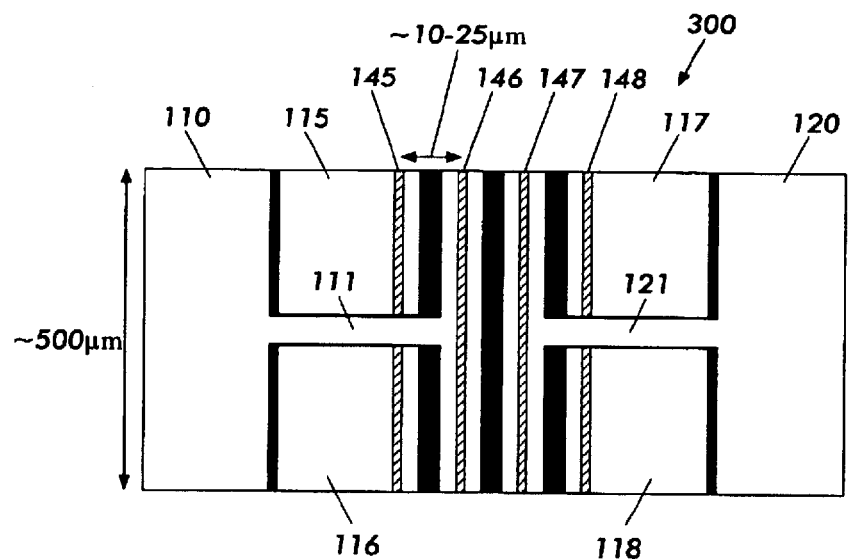
FIG. 3a shows a top view of the layout of a quad-spot laser diode structure with air-bridge structures in an embodiment in accordance with the present invention.
Figure 3B:
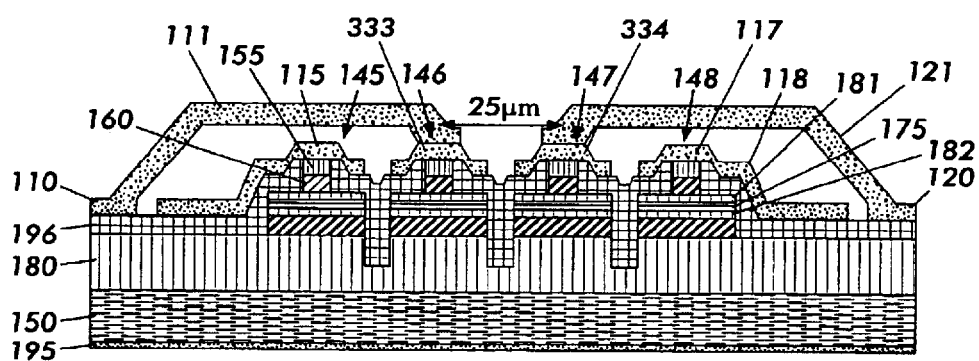

An embodiment in accordance with the present invention is shown in FIGS. 3a and 3b. Quad-spot InGaAlN laser diode structure 300 is grown on conducting substrate 150. Au-air-bridges 111 and 121 are used to contact laser diodes 146 and 147, respectively. The use of Au-air-bridges 111 and 121 allows p-metal contacts 115 and 117 to provide uninterrupted contact to laser diodes 146 and 147, respectively. This eliminates the unpumped regions of laser diodes 146 and 147 seen in FIGS. 1a–2 and reduces the level of the required threshold current. The regions beneath Au-air-bridges may be filled with dielectric material such as silicon-oxy-nitride, silicon dioxide or polyimide. However, using dielectric material as a filler increases parasitic capacitance versus using air and may not be desirable for certain applications, especially high-speed modulation.

Figure 4A:
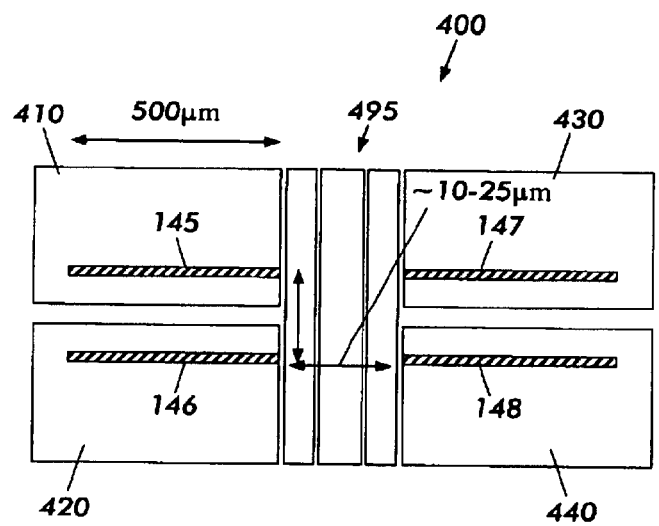
FIG. 4a shows a top view of a dual dual-spot surface emitting laser diode structure in an embodiment in accordance with the present invention.

An embodiment in accordance with this invention of surface emitting quad-spot laser diode 400 is shown in FIG. 4a. A two by two array configuration is shown in FIG. 4a. Each side of channel structure 495 has a dual spot laser diode structure. This structure can be generalized to an arbitrary number of laser diodes, with half of the total number of laser diodes residing on one side of channel structure 495 and the remainder residing on the other side of channel structure 495. P-metal contact 410 contacts laser diode 145, p-metal contact 420 contacts laser diode 146, p-metal contact 430 contacts laser diode 147 and p-metal contact 440 contacts laser diode 440. All laser diodes 145, 146, 147 and 148 share n-metal contact 195 (see FIG. 4b) to complete the current loop.

Figure 4B:
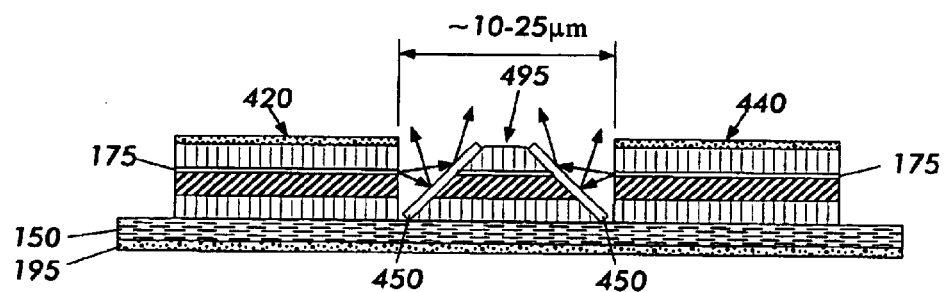

FIG. 4b shows a cross section of surface emitting quad-spot laser diode structure 400 across channel structure 495. Channel structure 495 contains mirrors 450 for outcoupling light from laser diodes 145, 146, 147 and 148 into a generally vertical direction as shown. Aluminum coated mirrors 450 are dry etched using, for example, chemically assisted ion-beam etching (CAIBE) and the inclination angle may be adjusted by varying etching parameters. A suitable inclination angle for mirrors 450 in FIG. 4bis 45 degrees. The spacing between adjacent laser diodes 145 and 146 or 147 and 148 is typically from about 10 to 25 μm.

Figure 5:
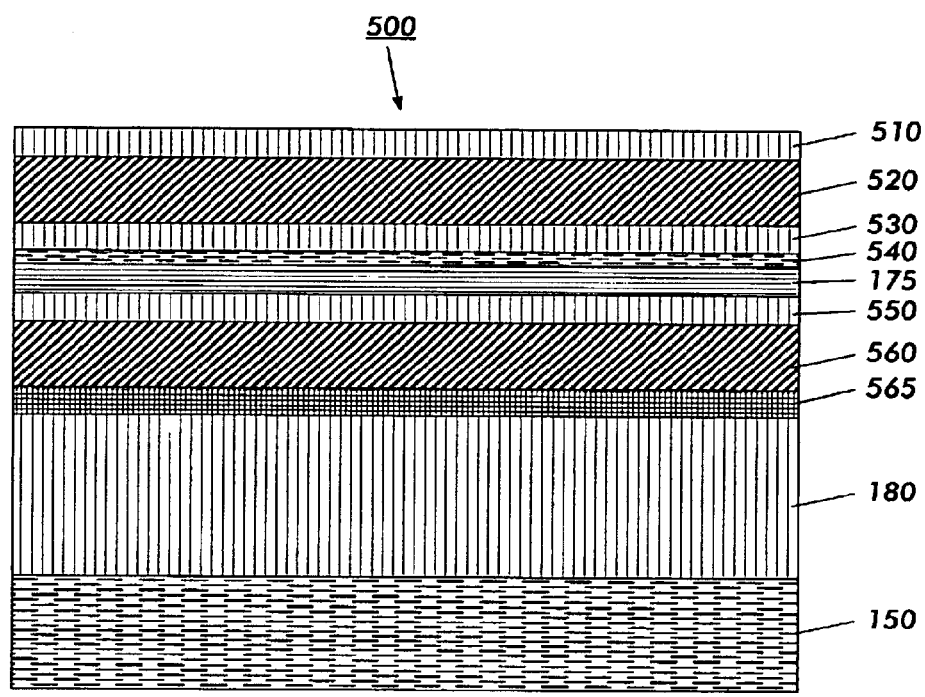
FIG. 5 shows the layers of a quad-spot laser diode structure in an embodiment in accordance with the present invention.

In an embodiment in accordance with this invention, FIG. 5 shows InGaAlN heterostructure wafer 500 grown by metalorganic chemical vapor deposition (MOCVD) on conducting substrate 150. Conducting substrate 150 is typically SiC or GaN and has a thickness typically ranging on the order of 100 μm to 400 μM. GaN:Mg cap layer 510 is 0.1 μm thick and adjoins $Al_{0.08}Ga_{0.92}N$:Mg cladding layer 520 which has a typical thickness in the range of 0.5 to 1.0 μm. Note that Mg is added to produce a p-type conductivity. A second GaN:Mg layer 530 also 0.1 μm thick lies underneath cladding layer 520 and serves as a p-doped waveguide. $Al_{0.2}Ga_{0.8}N$:Mg layer 540 is typically 20 μm thick and serves as a tunnel barrier layer to prevent leakage of injected electrons. GaN:Si layer 550 functions as an n-doped waveguide for InGaN multi-quantum well active region 175. Note that Si is added to produce an n-type conductivity material. $Al_{0.08}Ga_{0.92}N$:Si cladding layer 560 has a typical thickness from 0.5 to 1.5 μm. $In_{0.03}Ga_{0.97}N$:Si layer 565 has a typical thickness of 50 nm and functions as a defect reducing layer.

GaN:Si layer 180 with a typical thickness of 4 μm lies above conducting substrate 150 and serves to establish a good quality material for subsequent depositions (i.e., layer 180 serves as a buffer layer). Further details may be found in Nakamura and Fasol incorporated by reference above. Once structure 500 has been grown by MOCVD activation of Mg p-doping is performed in (Al)GaN:Mg layers 510, 520, 530 and 540. Activation of dopants is accomplished by rapid thermal annealing at 850° C. for 5 minutes in $N_2$ ambient.

Figure 6A:
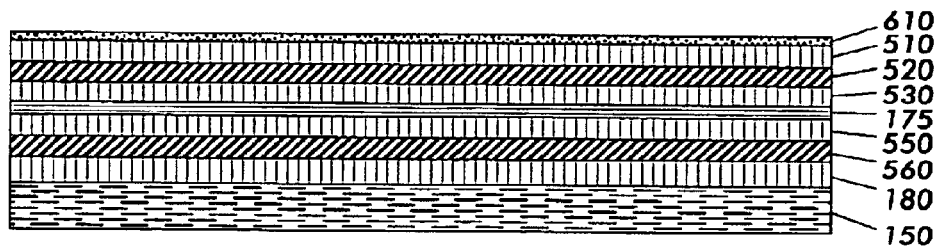
FIGS. 6a–6e show processing steps for a quad-spot laser diode structure in an embodiment in accordance with the present invention.
Figure 6B:
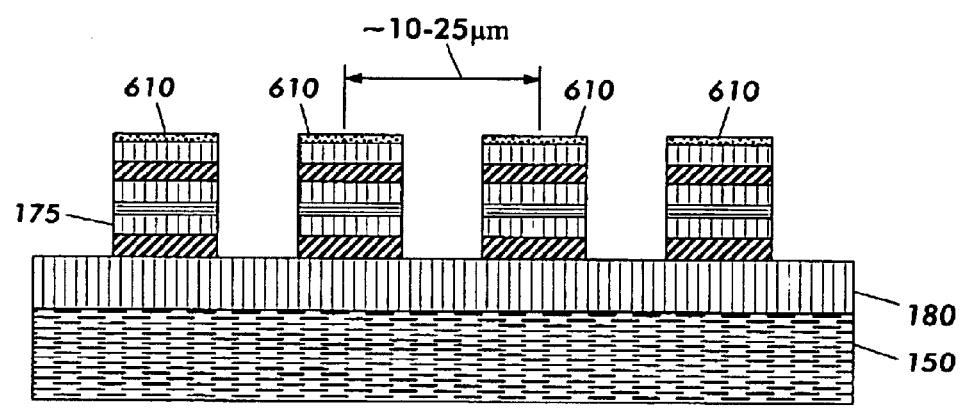

FIGS. 6a–6e show the major processing steps for a quad-spot laser diode structure in accordance with the present invention. Note that layers 540 and 565 are not shown in FIGS. 6a–6f. FIG. 6a shows wafer 500 after p-metal deposition. P-metal layer 610 is typically nickel-gold (Ni—Au) and deposited using thermal evaporation with rapid thermal annealing (RTA) in an $N_2$ ambient. Dry-etching using CAIBE or reactive ion etching (RIE) in an $Ar/Cl_2/BCl_3$ gas mixture creates the mesa structures shown in FIG. 6b.

Figure 6C:
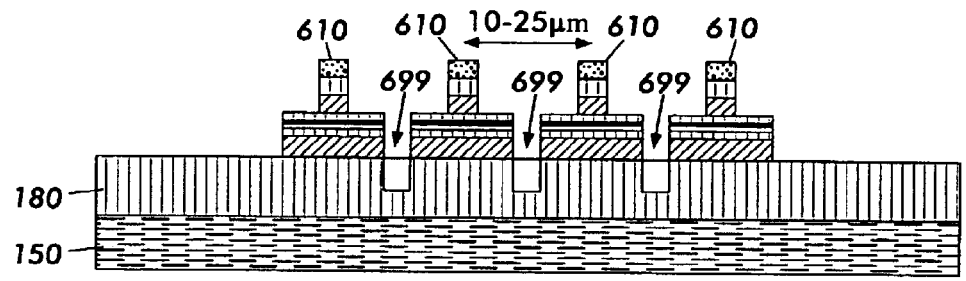

FIG. 6c shows wafer 500 after etching of ridge waveguides and trenches 699 in an $Ar/Cl_2/BCl_3$ gas mixture using CAIBE or RIE. Subsequently, dielectric deposition of dielectric layer 196, typically silicon-oxy-nitride, silicon dioxide or silicon nitride, using plasma enhanced chemical vapor deposition (PE-CVD) takes place. Polyimide may also be used for layer 196. Contact windows are opened in the dielectric using radio frequency plasma etching in a $CF_4/O_2$ ambient atmosphere.

Figure 6D:
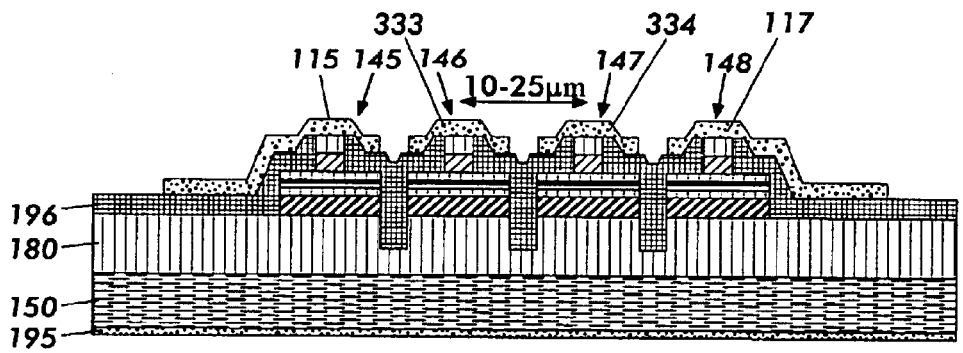
Figure 6E:
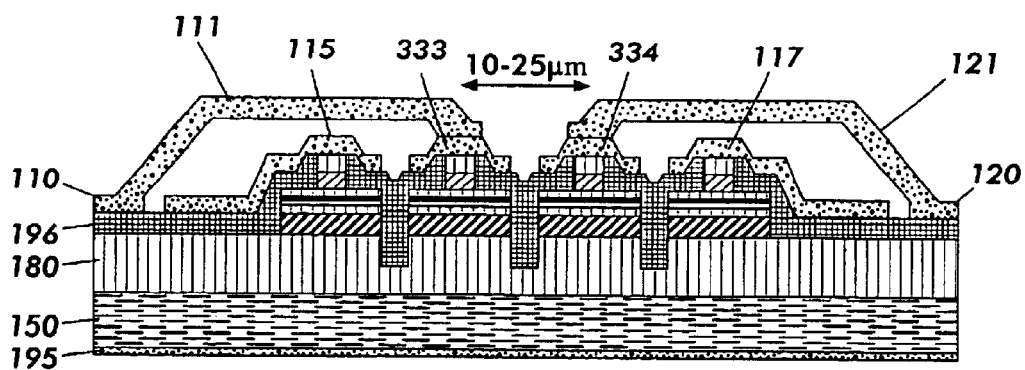

FIG. 6d shows the result of depositing dielectric layer 196 and p-metal deposition by thermal evaporation to form p-metal pads 115, 333, 334 and 117. Typically, p-metal pads 115, 333, 334 and 117 are made of titanium-gold (Ti—Au). Substrate 150 is thinned by mechanical polishing on diamond pads prior to deposition of n-metal layer 195 on the backside of substrate 150 by thermal evaporation. An RTA in an $N_2$ ambient serves to anneal n-metal layer 195 for lowest contact resistance. N-metal layer 195 is typically made of titanium-aluminum (Ti—Au). If the quad-spot laser diode structure utilizes Au-air-bridge structures, another Ti—Au deposition occurs to contact inner laser diodes 146 and 147 via Au-air bridge structures 111 and 121, respectively. Au-air-bridge structures 111 and 121 may be constructed by first putting down a layer of photoresist (not shown) and subsequently depositing the Ti—Au metal on top of the photoresist. The photoresist is subsequently dissolved away to leave air under Au-air-bridges 111 and 121. Alternatively, a second dielectric layer (silicon-oxy-nitride, silicon dioxide or silicon nitride, not shown) may be deposited using PE-CVD to isolate p-metal pads 333 and 334 of inner laser diodes 146 and 147, respectively, with subsequent deposition of Ti—Au contacts on top of the dielectric layer (not shown).

The resulting laser diode structure using Au air-bridge structures 111 and 121 is shown in FIG. 6a. Laser diode facets are cleaved and diced into individual structures. To reduce the laser threshold current, a $SiO_2/TiO_2$ high reflective coating is deposited on the front and backside of laser diode facets (not shown) using e-beam evaporation. Typically, it is desirable to use a lower reflectivity for the front laser diode facets.

While the invention has been described in conjunction with specific embodiments, it is evident to those skilled in the art that many alternatives, modifications, and variations will be apparent in light of the foregoing description. Accordingly, the invention is intended to embrace all other such alterative, modifications, and variations that fall within the spirit and scope of the appended claims.

What is claimed is:

1. A structure for an array of laser diodes comprising:
    a metallization layer comprising type one metal contacts;
    a first type one metal contact pad electrically coupled to a first of said type one metal contacts;
    a second type one metal contact pad electrically coupled to a second of said type one metal contacts by an air-bridge structure disposed above said first of said type one metal contacts;
    a first active region for generating light disposed below said metallization layer and being electrically coupled to said first of said type one metal contacts in said metallization layer;
    a second active region separated from the first active region, the second active region for generating light proximate to said first active region and located laterally with respect to said first active region, said second active region being disposed below said first metallization layer, said second active region being electrically coupled to said second of said type one metal contacts in said metallization layer,
    a conducting substrate supporting said first active region and said second active region and said metallization layer; and
    a type two metallization layer affixed to said conducting substrate such that said type two metallization layer Is electrically coupled to said first active region and said second active region.

2. A structure for an array of laser diodes comprising:
    a metallization layer comprising type one metal contacts;
    a first type one metal contact pad electrically coupled to a first of said type one metal contacts;
    a second type one metal contact pad electrically coupled to a second of said type one metal contacts by an air-bridge structure disposed above said first of said type one metal contacts;
    a first active region for generating light disposed below said metallization layer and being electrically coupled to said first of said type one metal contacts in said metallization layer,
    a second active region separated from the first active region, the second active region for generating light proximate to said, first active region and being disposed below said first metallization layer, said second active region being electrically coupled to said second of said type one metal contacts in said metallization layer;
    a channel structure separating said first active region and said second active region, said channel structure comprising mirrors such that light generated by said first active region and said second active region is outcouple by said mirrors in a direction substantially perpendicular to said metallization layer;
    a conducting substrate supporting said first active region and said second active region and said metallization layer; and
    a type two metallization layer affixed to said conducting substrate such that said type two metallization layer is electrically coupled to said first active region and said second active region.

3. The structure of claim 1 wherein said air-bridge structure is comprised of titanium-gold metal.

4. The structure of claim 2 wherein said mirrors are inclined approximately forty-five degrees with respect to said conducting substrate.

5. The structure of claim 1 wherein said type one metal contacts are p-type metal contacts.

6. The structure of claim 1 wherein said first active region comprises multi-quantum wells.

7. The structure of claim 1 wherein said conducting substrate is comprised of silicon carbide.

8. The structure of claim 1 wherein said first active region is comprised of GaN.

9. A method for making an array of laser diodes comprising the steps of:
    providing a metallization layer comprising type one metal contacts; providing a first type one metal contact pad electrically coupled to a first of said type one metal contacts:
    providing a second type one metal contact pad electrically coupled to a second of said type one metal contacts by an air-bridge structure disposed above said first of said type one metal contacts;

providing a first active region for generating light disposed below said metallization layer and being electrically coupled to said first of said type one metal contacts in said metallization layer;

providing a second active region separated from the first active region, the second active region located laterally adjacent to said first active region, said second active region for generating light proximate to said first active region and disposed below said metallization layer, said second active region being electrically coupled to said second of said type one metal contacts in said metallization layer;

providing a conducting substrate supporting said first active region and said second active region and said metallization layer, and providing a type two metallization layer affixed to said conducting substrate such that said type two metallization layer is electrically coupled to said first active region and said second active region.

10. A method for making an array of laser diodes comprising the operations of:

providing a metallization layer comprising type one metal contacts;

providing a first type one metal contact pad electrically coupled to a first of said type one metal contacts;

providing a second type one metal contact pad electrically coupled to a second of said type one metal contacts by an air-bridge structure disposed above said first of said type one metal contacts;

providing a first active region for generating light disposed below; said metallization layer and being electrically coupled to said first of said type one metal contacts in said metallization layer;

providing a second active region separated from the first active region, the second active region for generating light proximate to said first active region and disposed below said metallization layer, said second active region being electrically coupled to said second of said type one metal contacts in said metallization layer;

providing a channel structure, that separates said first active region from said second active region, said channel structure comprising mirrors such that light generated by said first active region and said second active region is outcoupled by said mirrors in a direction substantially perpendicular to said metallization layer;

providing a conducting substrate supporting said first active region and said second active region and said metallization layer; and providing a type two metallization layer affixed to said conducting substrate such that said type two metallization layer is electrically coupled to said first active region and said second active region.

11. The method of claim 9 wherein said air-bridge structure is comprised of titanium-gold metal.

12. The method of claim 10 wherein said mirrors are inclined approximately forty-five degrees with respect to said conducting substrate.

13. The method of claim 9 wherein said type one metal contacts are p-type metal contacts.

14. The method of claim 9 wherein said first active region comprises multi-quantum wells.

15. The method of claim 9 wherein said conducting substrate is comprised of silicon carbide.

16. The method of claim 9 wherein said first active region is comprised of GaN.

17. A structure for an array of laser diodes comprising:

a first metallization layer comprising type one metal contacts;

a second metallization layer comprising at least one type two metal contact;

a plurality of active regions for generating light disposed below said first metallization layer, each active region in said plurality of active regions to output light, each active region in said plurality of active regions separated from adjacent active regions, each active region in said plurality of active regions located laterally with respect to adjacent active regions, each active region in said plurality of active regions electrically coupled to a corresponding type one metal contact in said first metallization layer; and a conducting substrate that supports said plurality of active regions, said conducting substrate couples at least two active regions in the plurality of active regions for generating light to the at least one type two metal contact in the second metallization layer.

18. The structure of claim 1 wherein the first active region outputs a first beam of light and the second active region outputs a second beam of light, the first beam of light located laterally adjacent to the second beam of light.

19. A structure for an array of laser diodes comprising:

a conductive substrate;

first and second separated mesa structures on the substrate, each including an active nitride region that generates light in response to electrical signals; the first and second mesa structures being located laterally adjacent to each other; the active nitride region of each mesa structure being electrically connected to the substrate;

first and second contacts that provide electrical signals respectively to the active nitride regions of the first and second mesa structures; and a common contact connected to the substrate, the common contact providing current loops through the first and second active regions.

20. The structure of claim 19, further comprising:

insulating material between the first and second mesa structures.

* * * * *